(12) United States Patent
Zhang et al.

(10) Patent No.: US 7,888,983 B2
(45) Date of Patent: Feb. 15, 2011

(54) PREDETERMINED DUTY CYCLE SIGNAL GENERATOR

(75) Inventors: Kun Zhang, Austin, TX (US); Kenneth C. Barnett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/558,278

(22) Filed: Sep. 11, 2009

(65) Prior Publication Data

US 2010/0327929 A1 Dec. 30, 2010

Related U.S. Application Data

(60) Provisional application No. 61/220,831, filed on Jun. 26, 2009.

(51) Int. Cl.
 *H03K 3/017* (2006.01)
(52) U.S. Cl. .................................... 327/175; 327/172

(58) Field of Classification Search ................. None
See application file for complete search history.

(56) References Cited

U.S. PATENT DOCUMENTS 6,278,307 B1 * 8/2001 El-Kik ...................... 327/175
7,288,977 B2 * 10/2007 Stanley ..................... 327/172

* cited by examiner

*Primary Examiner*—Cassandra Cox
(74) *Attorney, Agent, or Firm*—Jiayu Xu (57) ABSTRACT

Techniques for generating a signal having a predetermined duty cycle. In an exemplary embodiment, a first counter is configured to count a first number of cycles of an oscillator signal, and a second counter is configured to count a second number of cycles of the oscillator signal, with the second number being greater than the first number. The output of the second counter is used to reset the first and second counters, while the outputs of the first and second counters further drive a toggle latch for generating the signal having predetermined duty cycle. Further aspects include techniques for accommodating odd and even values for the second number.

22 Claims, 8 Drawing Sheets

PREDETERMINED DUTY CYCLE SIGNAL GENERATOR

RELATED APPLICATIONS

This application claims priority to U.S. Prov. App. Ser. No. 61/220,831, entitled "VARIABLE DUTY CYCLE SIGNAL GENERATOR," filed Jun. 26, 2009, assigned to the assignee of the present disclosure, the contents of which are hereby incorporated by reference in their entirety.

BACKGROUND

1. Field

The disclosure relates to electronics, and in particular, to techniques for generating signals having predetermined duty cycles.

2. Background

Modern electronic circuit designs employ various instances of clock signals. For example, an analog-to-digital converter (ADC) may require a clock signal used to sample analog signals for conversion to digital signals. In some cases, design specifications call for clock signals having specific, well-defined duty cycles, e.g., 50% duty cycle, along with low jitter, low phase noise, and low spur level specifications.

It would be desirable to provide simple and efficient techniques for generating clock signals having well-defined duty cycles, wherein parameters such as the clock frequency and duty cycle may be readily programmed as necessary.

SUMMARY

An aspect of the present disclosure provides an apparatus for generating an output signal having a predetermined duty cycle, the apparatus comprising: a first counter configured to count a first number of cycles of a signal derived from an oscillator signal, the output signal of the first counter configured to transition after the first number of cycles is counted; a second counter configured to count a second number of cycles of the oscillator signal, the output signal of the second counter configured to transition after the second number of cycles is counted, the first and second counters configured to be reset upon a transition in the output signal of the second counter; and a toggle latch configured to generate the output signal having predetermined duty cycle, the output signal of the toggle latch configured to transition from a first state to a second state upon a transition in the output signal of the first counter, the output signal of the toggle latch further configured to transition from the second state to the first state upon a transition in the output signal of the second latch.

Another aspect of the present disclosure provides a method for generating an output signal having a predetermined duty cycle, the method comprising: counting a first number of cycles of a signal derived from an oscillator signal; generating a transition in a first output signal after the first number of cycles is counted; counting a second number of cycles of the oscillator signal, the second number being greater than the first number; generating a transition in a second output signal after the second number of cycles is counted; resetting the counting of the first and second numbers upon a transition in the second output signal; generating a transition in the output signal from a first state to a second state upon a transition in the first output signal; and generating a transition in the output signal from the second state to the first state upon a transition in the second output signal.

Yet another aspect of the present disclosure provides an apparatus for generating an output signal having a predetermined duty cycle, the apparatus comprising: means for counting a first number of cycles of a signal derived from an oscillator signal, and for generating a transition in a first output signal after the first number of cycles is counted; means for counting a second number of cycles of the oscillator signal greater than the first number, and for generating a transition in a second output signal after the second number of cycles is counted; means for resetting the counting the first and second numbers upon a transition in the second output signal; and means for generating a transition in the output signal from a first state to a second state upon a transition in the first output signal, and for generating a transition in the output signal from the second state to the first state upon a transition in the second output signal.

Yet another aspect of the present disclosure provides a computer program product storing code for causing a computer to generate an output signal having a predetermined duty cycle, the code comprising: code for causing a computer to count a first number of cycles of a signal derived from an oscillator signal and generate a transition in a first output signal after the first number of cycles is counted; code for causing a computer to count a second number of cycles of the oscillator signal greater than the first number and generate a transition in a second output signal after the second number of cycles is counted; code for causing a computer to reset the count of the first and second numbers upon a transition in the second output signal; and code for causing a computer to generate a transition in the output signal from a first state to a second state upon a transition in the first output signal and generate a transition in the output signal from the second state to the first state upon a transition in the second output signal.

Yet another aspect of the present disclosure provides a device for wireless communications, the device comprising at least one digital-to-analog converter (DAC) for converting a digital TX signal to an analog TX signal, at least one baseband TX amplifier for amplifying the analog TX signal, a TX LO signal generator, an upconverter coupled to the TX LO signal generator and the at least one baseband TX amplifier, a TX filter coupled to the output of the upconverter, a power amplifier (PA) coupled to the TX filter, an RX filter, a low-noise amplifier (LNA) coupled to the RX filter, an RX LO signal generator, a downconverter coupled to the RX LO signal generator and the RX filter, at least one low-pass filter coupled to the output of the downconverter, at least one analog-to-digital converter (ADC) for converting the output of the low-pass filter into a digital signal, a clock signal generator, at least one of the DAC and the ADC being driven by a clock signal generated by the clock signal generator, the clock signal generator comprising: a first counter configured to count a first number of cycles of a signal derived from an oscillator signal, the output signal of the first counter configured to transition after the first number of cycles is counted; a second counter configured to count a second number of cycles of the oscillator signal, the output signal of the second counter configured to transition after the second number of cycles is counted, the first and second counters configured to be reset upon a transition in the output signal of the second counter; and a toggle latch configured to generate the clock signal, the output signal of the toggle latch configured to transition from a first state to a second state upon a transition in the output signal of the first counter, the output signal of the toggle latch further configured to transition from the second state to the first state upon a transition in the output signal of the second latch.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

According to the present disclosure, techniques are provided for generating a periodic signal such as a clock signal having a predetermined duty cycle and frequency.

Figure 1:
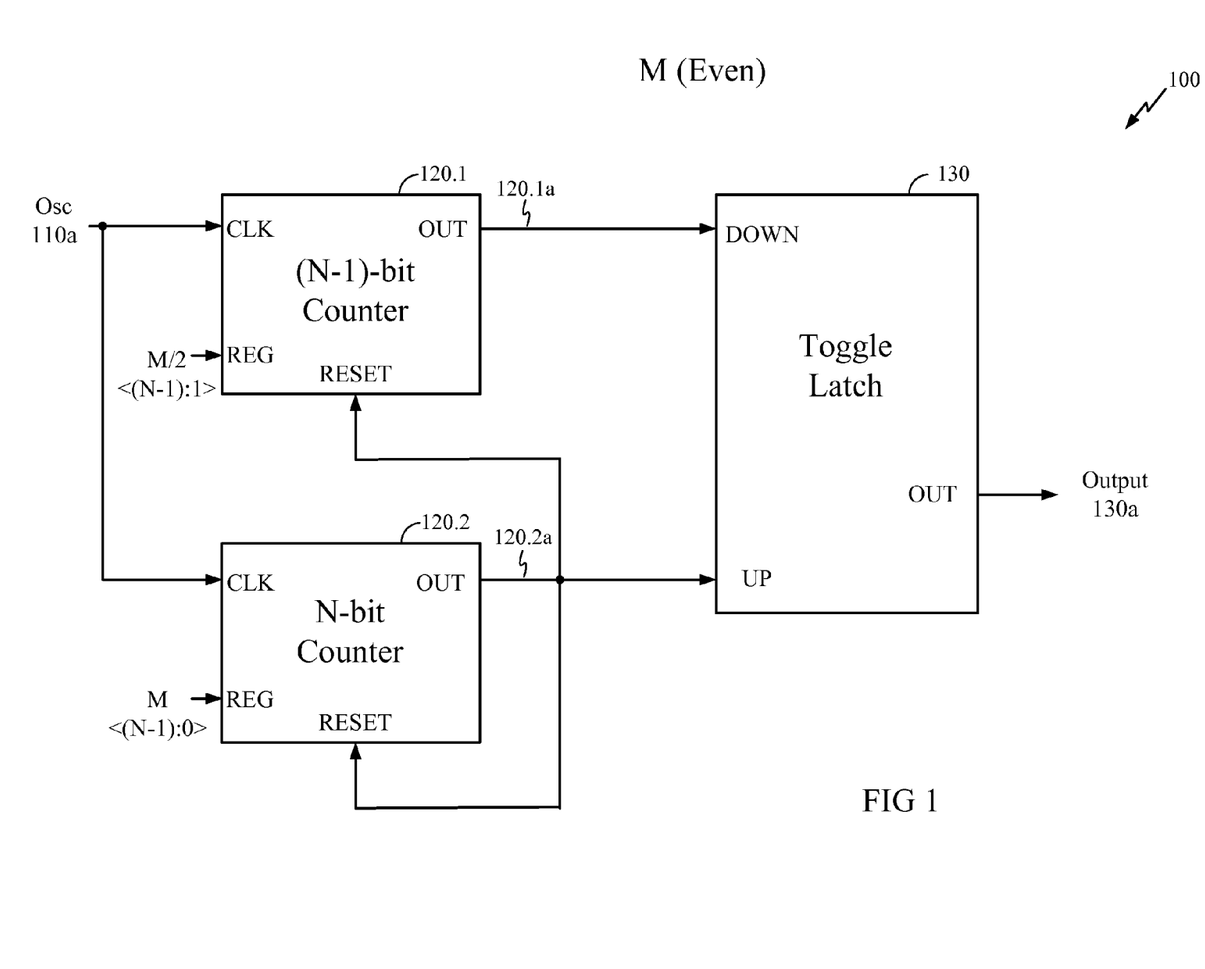
FIG. 1 illustrates an exemplary embodiment of a signal generator according to the present disclosure.

FIG. 1 illustrates an exemplary embodiment of a signal generator 100 according to the present disclosure. In FIG. 1, the signal generator 100 includes an (N−1)-bit counter 120.1 (also denoted herein as the "first counter"), an N-bit counter 120.2 (also denoted herein as the "second counter"), and a toggle latch 130. Each of the counters 120.1 and 120.2 counts a total number of cycles elapsing at its CLK input up to the value at its REG input, whereupon a previously LOW output signal at its OUT output is asserted HIGH for some predetermined time interval.

In FIG. 1, the CLK input to each of the counters 120.1 and 120.2 is supplied with an oscillator signal, Osc 110a. The REG input to the (N−1)-bit counter 120.1 is supplied with an (N−1)-bit value M/2, while the REG input to the N-bit counter 120.2 is supplied with the corresponding N-bit value M. In the exemplary embodiment shown, the value of M is expressed in N-bit binary form, while the value of M/2 is correspondingly expressed in (N−1)-bit binary form, e.g., using the (N−1) most significant bits (MSB's) of the N-bit representation of M. For the signal generator 100, the value M may be constrained to be even.

One of ordinary skill in the art will appreciate that the specific bit representations shown for M and M/2 are for illustrative purposes only, and are not meant to limit the scope of the present disclosure.

In an exemplary embodiment, counter 120.1 counts a total of M/2 cycles elapsing in the signal Osc 110a, whereupon its OUT output 120.1a (also denoted herein as the "first output signal") is asserted HIGH. Similarly, counter 120.2 counts a total of M cycles elapsing in the signal Osc 110a, whereupon its OUT output 120.2a (also denoted herein as the "second output signal") is asserted high.

As shown in FIG. 1, the output 120.2a of counter 120.2 is fed back to a RESET input of both counters 120.1 and 120.2 to reset the counters to zero upon a detected rising edge at the RESET input.

The output signals 120.1a and 120.2a of counters 120.1 and 120.2 are further provided as DOWN and UP inputs, respectively, to a toggle latch 130. The toggle latch 130 generates at an OUT output a signal 130a that transitions to a logical HIGH when a rising edge is detected at the UP input, and transitions to a logical LOW when a rising edge is detected at its DOWN input.

Figure 2:
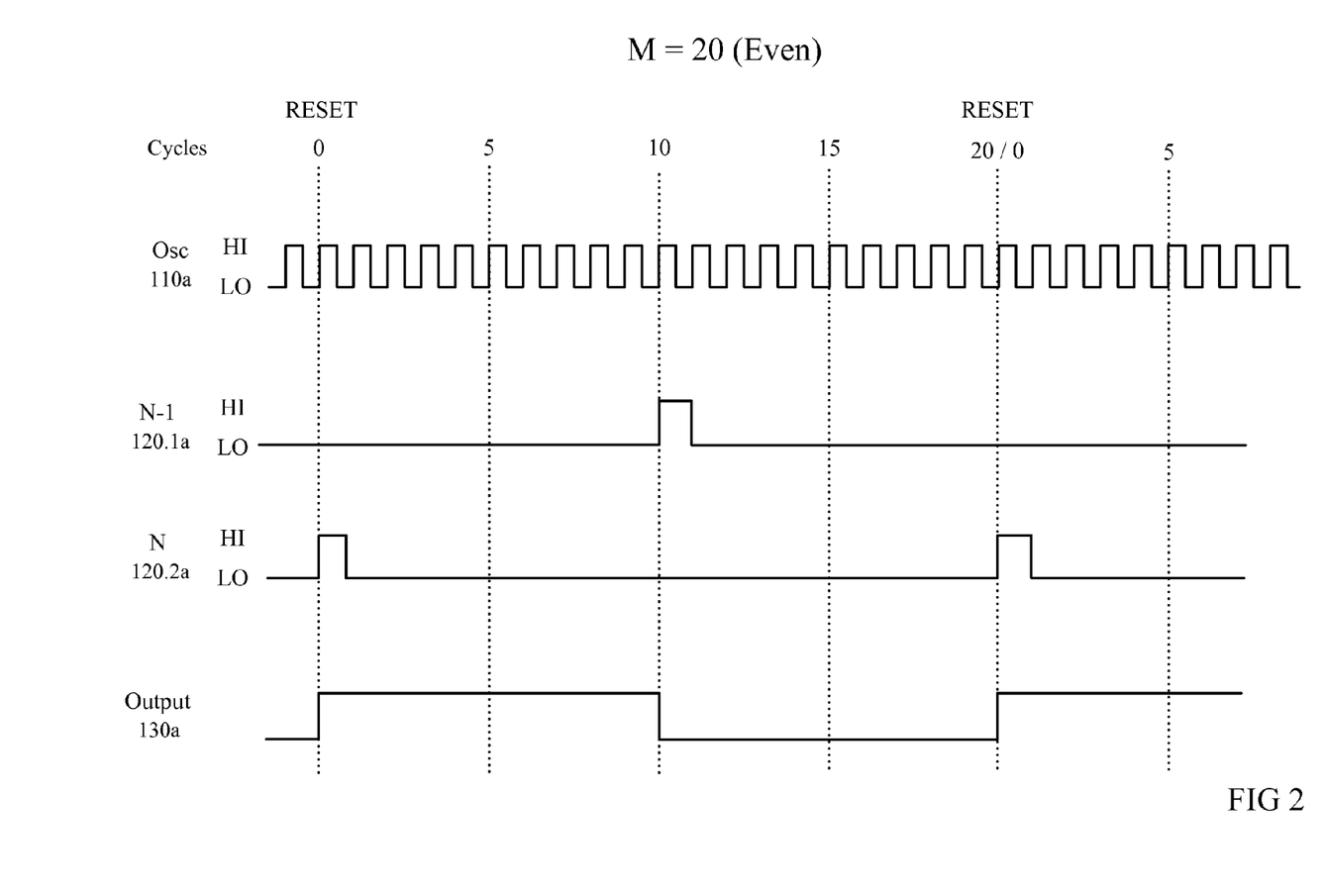
FIG. 2 illustrates an exemplary timing diagram showing the operation of the signal generator in FIG. 1 for a case wherein M=20.

FIG. 2 illustrates an exemplary timing diagram showing the operation of the signal generator 100 for a case wherein M=20. One of ordinary skill in the art will appreciate that the timing diagram is shown for illustrative purposes only, and is not meant to limit the scope of the present disclosure in any way.

FIG. 2 shows waveforms for signals Osc 110a, (N−1)-bit counter output 120.1a, N-bit counter output 120.2a, and toggle latch output 130a as illustrated in FIG. 1. In FIG. 2, cycles of the oscillator signal Osc 110a are marked by dashed lines in multiples of five for reference. At cycle 0 of Osc 110a, a rising edge is present in the N-bit counter output 120.2a, which resets the count of both the (N−1)-bit counter 120.1 and the N-bit counter 120.2. At cycle 10 of Osc 110a, the (N−1)-bit counter 120.1 finishes counting M/2=10 cycles (e.g., as measured from the rising edges of Osc 110a), and the signal 120.1a is asserted HIGH. At cycle 20 of Osc 110a, the N-bit counter 120.2 finishes counting M=20 cycles, and the signal 120.2a is also asserted HIGH. Based on the rising edges in the signals 120.1a and 120.2a, the toggle latch 130 generates the output signal 130a, which is seen to have a 50% duty cycle, and a period of M=20 cycles.

Note the rising edge in signal 120.2a further simultaneously resets the count of both counters 120.1 and 120.2 to zero after cycle 20 of Osc 110a.

Figure 3:
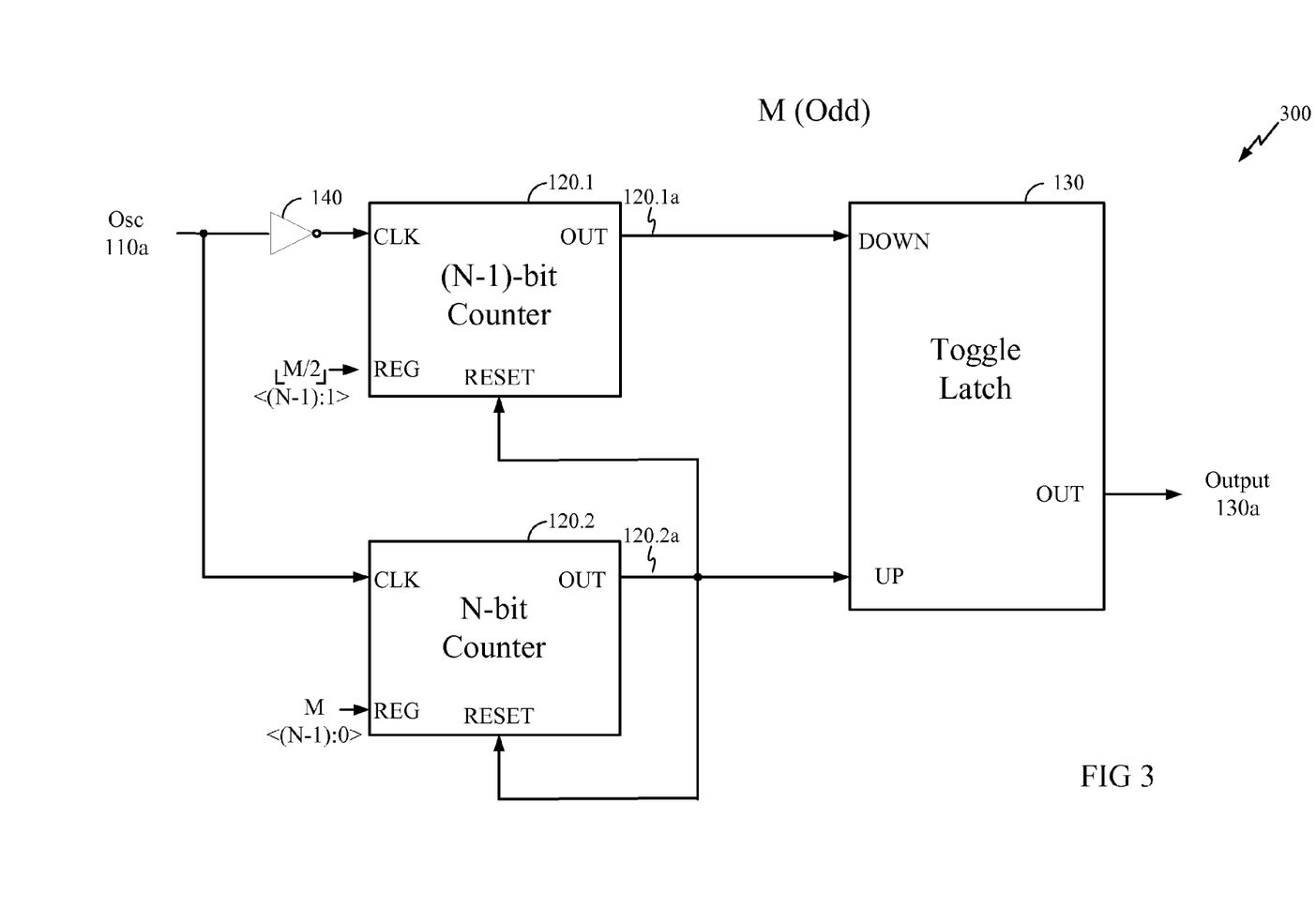
FIG. 3 illustrates an exemplary embodiment of a signal generator configured to process odd values of M.

FIG. 3 illustrates an exemplary embodiment of a signal generator 300 configured to process odd values of M. Note similarly labeled elements in FIGS. 1 and 3 correspond to blocks performing similar functions, unless otherwise noted.

In FIG. 3, an inverter 140 inverts the oscillator signal Osc 110a prior to coupling to the CLK input of the (N−1)-bit counter 120.1. Furthermore, the REG input to the (N−1)-bit counter 120.1 is supplied with the value ⌊M/2⌋, wherein the notation ⌊x⌋ denotes the greatest integer less than or equal to x. In this way, counter 120.1 is configured to count a total of ⌊M/2⌋ cycles (e.g., with each cycle starting on a falling edge of Osc 110a) elapsing in the signal Osc 110a, whereupon its output 120.1a is asserted HIGH.

Note the configuration of the N-bit counter 120.2 may be similar to that shown for the N-bit counter 120.2 in the signal generator 100 of FIG. 1.

Figure 4:
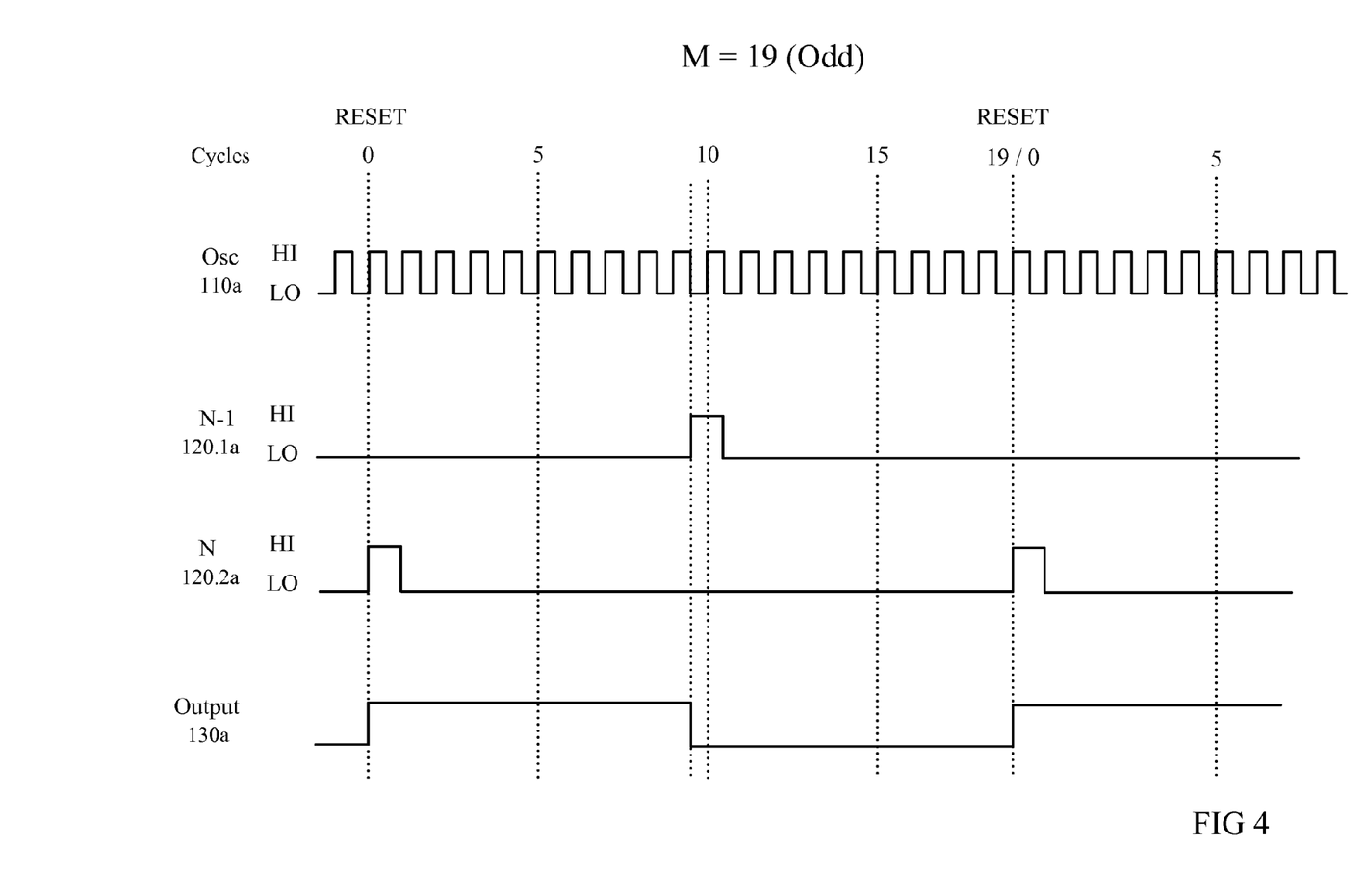
FIG. 4 illustrates an exemplary timing diagram of the operation of the signal generator in FIG. 3 for a case wherein M=19.

FIG. 4 illustrates an exemplary timing diagram of the operation of the signal generator 300 for a case wherein M=19. One of ordinary skill in the art will appreciate that the timing diagram is shown for illustrative purposes only, and is not meant to limit the scope of the present disclosure in any way.

In FIG. 4, at cycle 0 of Osc 110a, a rising edge is present in the N-bit counter output 120.2a, which resets the count of both the (N−1)-bit counter 120.1 and the N-bit counter 120.2. At the falling edge of Osc 110a immediately prior to cycle 10 of Osc 110a, the (N−1)-bit counter 120.1 finishes counting $\lfloor M/2 \rfloor$=9 cycles (i.e., with each cycle starting on a falling edge of Osc 110a, as earlier noted herein), and the signal 120.1a is asserted HIGH. At cycle 19 of Osc 110a, the N-bit counter 120 finishes counting M=19 cycles, and the signal 120.2a is also asserted HIGH. Based on the rising edges in the signals 120.1a and 120.2a, the toggle latch 130 generates the output signal 130a, which has a 50% duty cycle, and a period of M=19 cycles.

Figure 5:
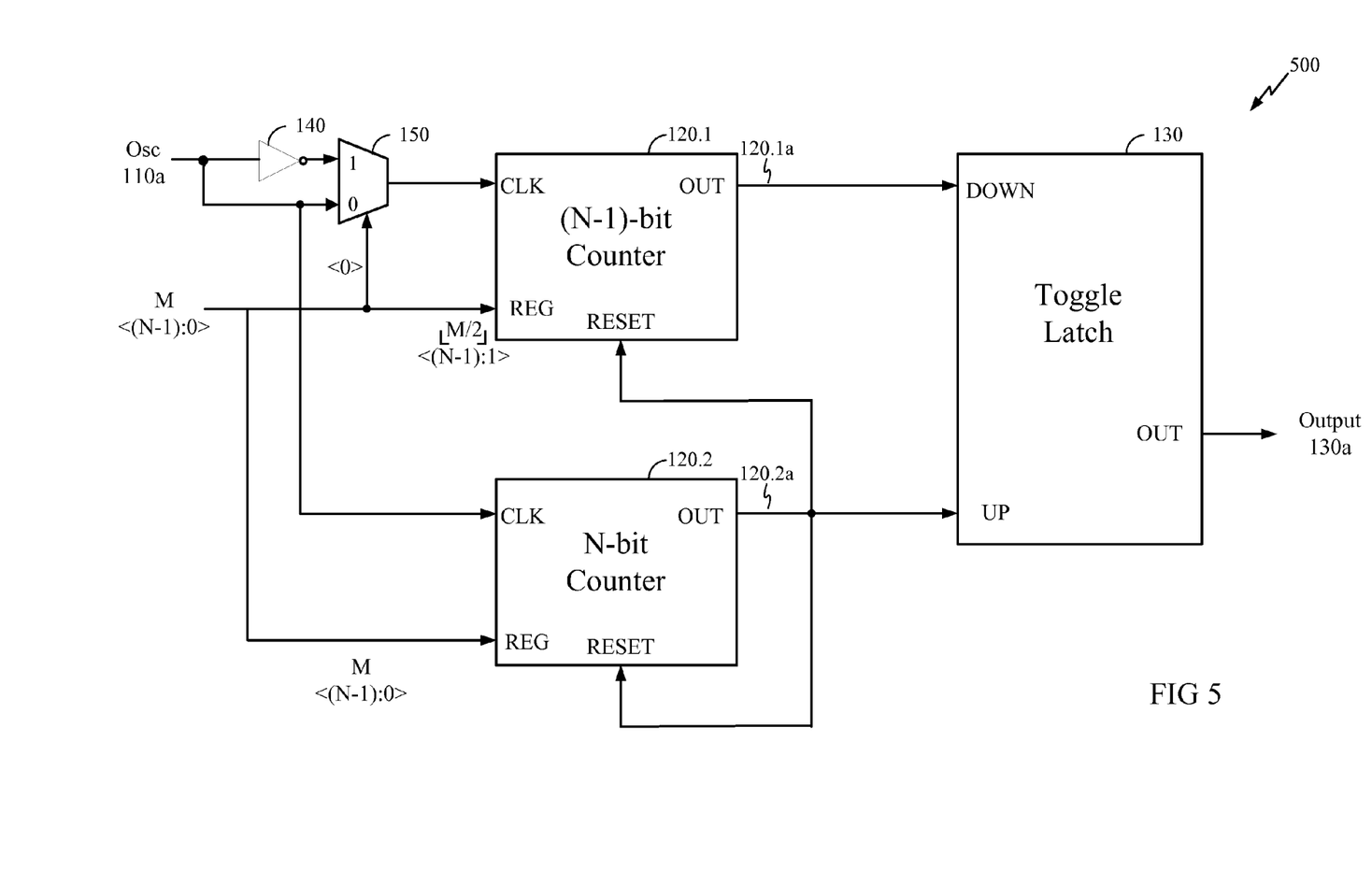
FIG. 5 illustrates an exemplary embodiment of a signal generator configured to process both even and odd values of M.

FIG. 5 illustrates an exemplary embodiment of a signal generator 500 configured to process both even and odd values of M. Note similarly labeled elements in FIGS. 1, 3, and 5 correspond to blocks performing similar functions, unless otherwise noted.

In FIG. 5, an inverter 140 inverts the oscillator signal Osc 110a prior to coupling to a 1-input of the multiplexer (or MUX) 150, while a 0-input of the MUX 150 is coupled directly to Osc 110a. The control signal to the MUX, which selects between the 1-input and the 0-input for feedthrough to the output of the MUX 150, is supplied by the 0-th bit of M, as shown. One of ordinary skill in the art will appreciate that the 0-th bit (or least significant bit, LSB) of M, when M is expressed in binary form, provides an indication of whether M is even or odd, and thus the CLK input of the (N−1)-bit may be supplied with the version of Osc 110a having the correct polarity, as previously described with reference to either of FIG. 1 or 3.

In accordance with the principles described herein, it will be appreciated that the period, and hence frequency, of the output signal 130a may be configured by selecting the value of M.

While exemplary embodiments of the disclosure have been described for generating output signals having a duty cycle of 50%, it will be appreciated that the duty cycle of the output signal 130a may be readily adjusted by varying the ratio between the total number of cycles counted by the counters 120.1 and 120.2. For example, in an alternative exemplary embodiment, to generate an output signal 130a having a duty cycle of 25%, the signal generator 500 of FIG. 5 may be modified to allow counter 120.1 to count to a value of M/4 (e.g., by providing the value of M/4 to the REG input of counter 120.1). For example, a register may be programmed that specifies a first number N and a second number M, wherein N may be provided to the REG input of the first counter, and M may be provided to the REG input of the second counter. In this manner, it will be appreciated that as long as the REG input to counter 120.1 is less than the REG input to counter 120.2, the signal generator 500 may generate a clock having an arbitrary duty cycle (to within a step size) by appropriate selection of the counter REG inputs.

Figure 6:
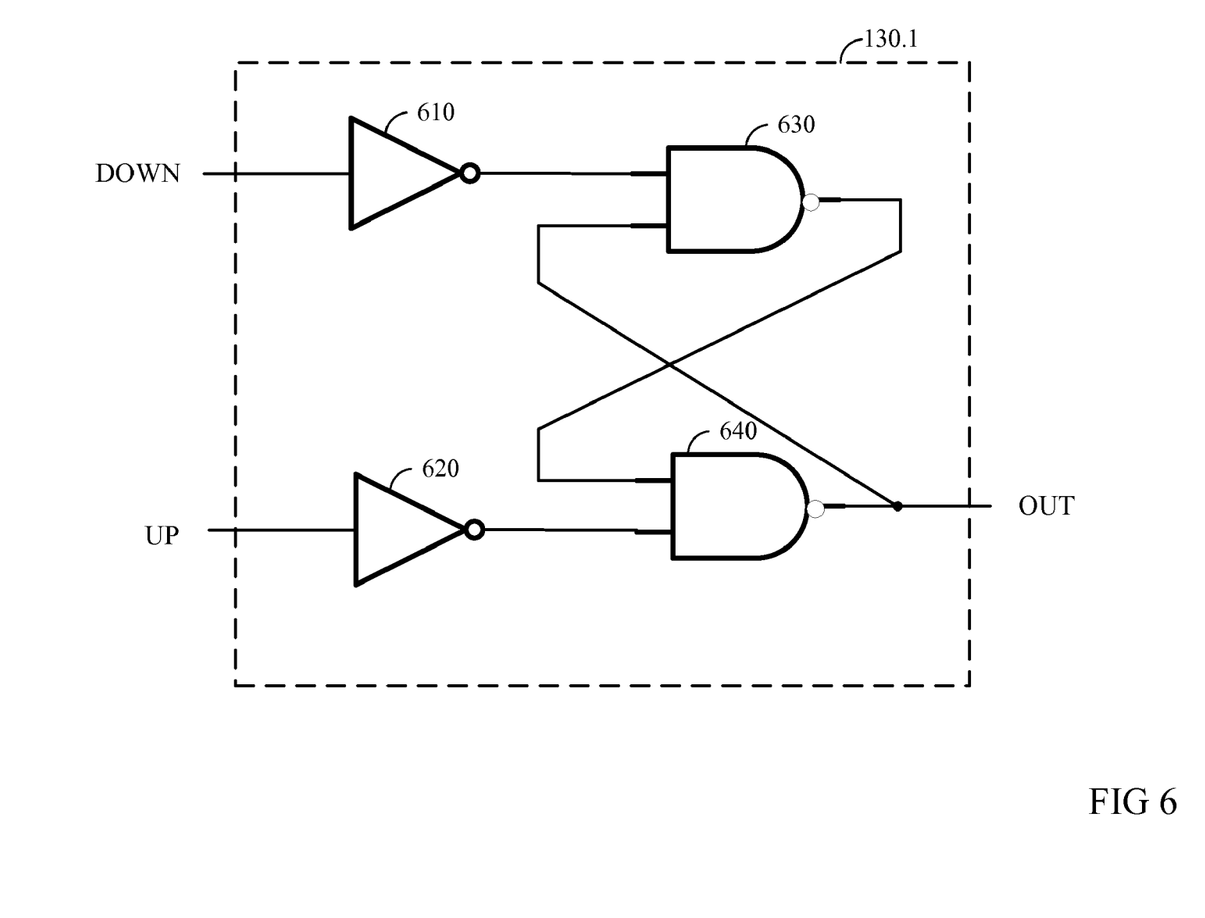
FIG. 6 illustrates an exemplary embodiment of a toggle latch according to the present disclosure.

FIG. 6 illustrates an exemplary embodiment 130.1 of a toggle latch 130 according to the present disclosure. Note the exemplary embodiment 130.1 is shown for illustrative purposes only, and is not meant to limit the scope of the present disclosure to any particular embodiment of a latch shown.

In FIG. 6, inverters 610, 620 and NAND gates 630, 640 are configured as an R-S flip-flop well-known to one of ordinary skill in the art to perform the functions described hereinabove for the toggle latch 130.

In an exemplary embodiment, counters 120.1 and 120.2 may both be asynchronous counters, and therefore the oscillator signal Osc 110a (or a signal derived therefrom, e.g., an inverted version of Osc 110a) need only drive a first stage of the asynchronous counters through the CLK input. This advantageously allows the high speed clock to drive only a relatively small load, and thus consume low power. Furthermore, in such an exemplary embodiment, only the first several flip-flops inside of the counters 120.1 and 120.2 require high-speed operation which may further ease the design.

Figure 7:
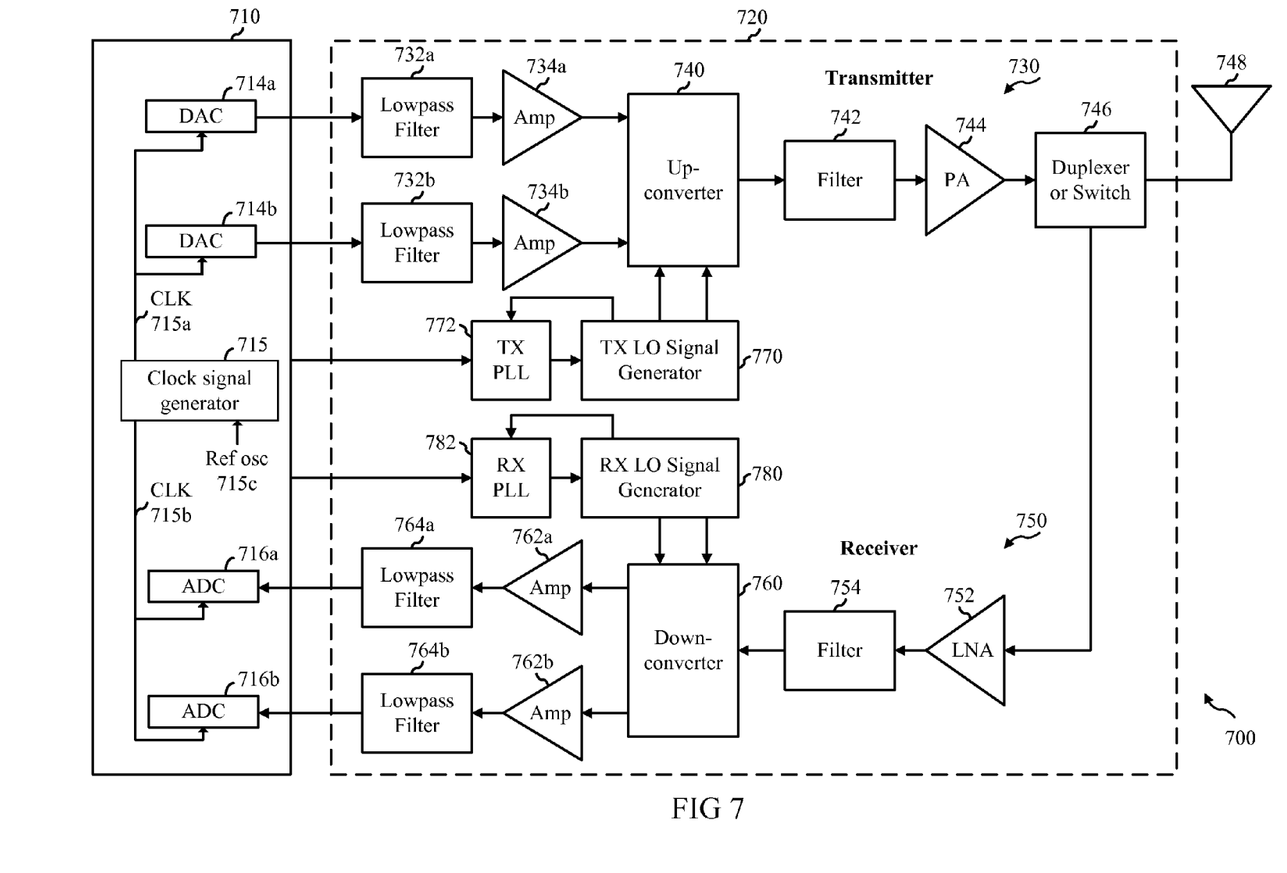
FIG. 7 illustrates a block diagram of a design of a wireless communication device in which the techniques of the present disclosure may be implemented.

FIG. 7 illustrates a block diagram of a design of a wireless communication device 700 in which the techniques of the present disclosure may be implemented. FIG. 7 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 7. Furthermore, other circuit blocks not shown in FIG. 7 may also be used to condition the signals in the transmitter and receiver. Some circuit blocks in FIG. 7 may also be omitted.

In the design shown in FIG. 7, wireless device 700 includes a transceiver 720 and a data processor 710. The data processor 710 may include a memory (not shown) to store data and program codes. Transceiver 720 includes a transmitter 730 and a receiver 750 that support bi-directional communication. In general, wireless device 700 may include any number of transmitters and any number of receivers for any number of communication systems and frequency bands. All or a portion of transceiver 720 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 7, transmitter 730 and receiver 750 are implemented with the direct-conversion architecture.

In the transmit path, data processor 710 processes data to be transmitted and provides I and Q analog output signals to transmitter 730. In the exemplary embodiment shown, the data processor 710 includes digital-to-analog-converters (DAC's) 714a and 714b for converting digital signals generated by the data processor 710 into the I and Q analog output signals. The DAC's 714a and 714b may each be provided with a clock signal 715a generated by a clock signal generator 715.

Within transmitter 730, lowpass filters 732a and 732b filter the I and Q analog output signals, respectively, to remove undesired images caused by the prior digital-to-analog conversion. Amplifiers (Amp) 734a and 734b amplify the signals from lowpass filters 732a and 732b, respectively, and provide I and Q baseband signals. An upconverter 740 upconverts the I and Q baseband signals with I and Q transmit (TX) local oscillating (LO) signals from a TX LO signal generator 770 and provides an upconverted signal. A filter 742 filters the upconverted signal to remove undesired images caused by the frequency upconversion as well as noise in a receive frequency band. A power amplifier (PA) 744 amplifies the signal from filter 742 to obtain the desired output power level and provides a transmit RF signal. The transmit RF signal is routed through a duplexer or switch 746 and transmitted via an antenna 748.

In the receive path, antenna 748 receives signals transmitted by base stations and provides a received RF signal, which is routed through duplexer or switch 746 and provided to a low noise amplifier (LNA) 752. The received RF signal is amplified by LNA 752 and filtered by a filter 754 to obtain a desirable RF input signal. A downconverter 760 downconverts the RF input signal with I and Q receive (RX) LO signals from an RX LO signal generator 780 and provides I and Q baseband signals. The I and Q baseband signals are amplified by amplifiers 762a and 762b and further filtered by lowpass filters 764a and 764b to obtain I and Q analog input signals, which are provided to data processor 710. In the exemplary embodiment shown, the data processor 710 includes analog-to-digital-converters (ADC's) 716a and 716b for converting the analog input signals into digital signals to be further processed by the data processor 710. The ADC's 716a and 716b may each be provided with a clock signal 715b generated by the clock signal generator 715.

In an exemplary embodiment, the clock signal generator 715 may utilize the techniques disclosed herein for generating signals with predetermined frequency and/or duty cycle. For example, the clock signal generator 715 may accept a reference oscillator signal 715c, and generate a clock signal having a predetermined frequency and/or duty cycle from the reference oscillator signal 715c using the architectures of signal generators 100, 300, 500, or any other architecture not explicitly disclosed herein that will be clear to one of ordinary skill in the art in light of the present disclosure. Such exemplary embodiments are contemplated to be within the scope of the present disclosure.

TX LO signal generator 770 generates the I and Q TX LO signals used for frequency upconversion. RX LO signal generator 780 generates the I and Q RX LO signals used for frequency downconversion. Each LO signal is a periodic signal with a particular fundamental frequency. A PLL 772 receives timing information from data processor 710 and generates a control signal used to adjust the frequency and/or phase of the TX LO signals from LO signal generator 770. Similarly, a PLL 782 receives timing information from data processor 710 and generates a control signal used to adjust the frequency and/or phase of the RX LO signals from LO signal generator 780.

Figure 8:
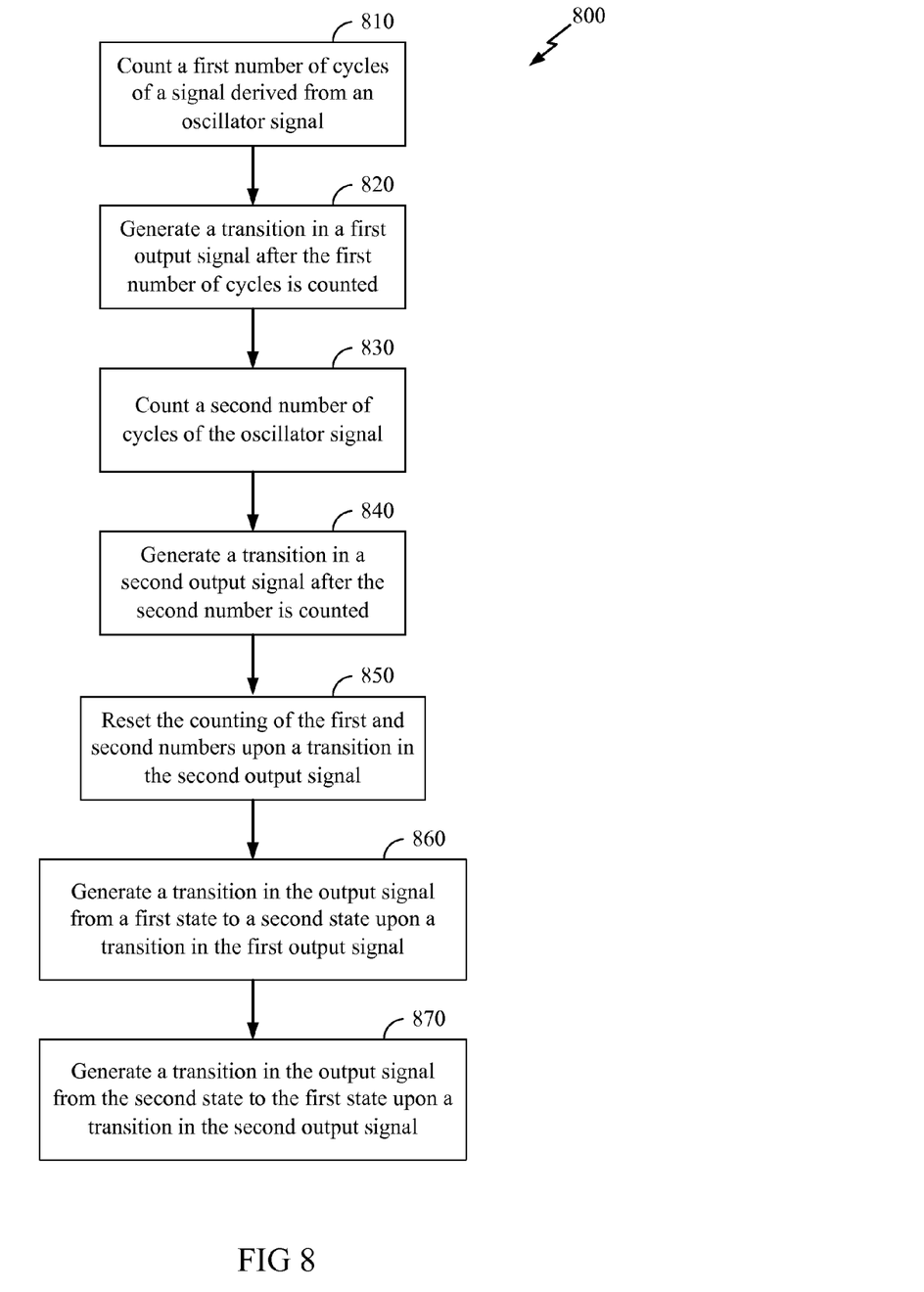
FIG. 8 illustrates an exemplary embodiment of a method according to the present disclosure.

FIG. 8 illustrates an exemplary embodiment 800 of a method according to the present disclosure. The method 800 is for generating an output signal having a predetermined duty cycle. Note the method 800 is shown for illustrative purposes only, and is not meant to limit the scope of the present disclosure.

In FIG. 8, at block 810, the method counts a first number of cycles of a signal derived from an oscillator signal.

At block 820, a transition in a first output signal is generated when the first number of cycles is counted.

At block 830, the method counts a second number of cycles of the oscillator signal. As previously described herein, the second number may be greater than the first number.

At block 840, a transition in a second output signal is generated when the second number of cycles is counted.

At block 850, the counting of the first and second numbers is reset upon a transition in the second output signal.

At block 860, a transition in the output signal from a first state to a second state is generated upon a transition in the first output signal.

At block 870, a transition in the output signal from the second state to the first state is generated upon a transition in the second output signal.

While exemplary embodiments described herein make specific reference to "rising" and "falling" edges of signals, one of ordinary skill in the art will appreciate that alternative exemplary embodiments may generally employ "rising" edges where the disclosure refers to "falling" edges, and vice versa. The same applies to logical signals designated herein as "HIGH" or "LOW." Such alternative exemplary embodiments are contemplated to be within the scope of the present disclosure.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The invention claimed is:

1. An apparatus for generating an output signal having a predetermined duty cycle, the apparatus comprising:
   a first counter configured to count a first number of cycles of a signal derived from an oscillator signal, the output signal of the first counter configured to transition after the first number of cycles is counted;
   a second counter configured to count a second number of cycles of the oscillator signal, the output signal of the second counter configured to transition after the second number of cycles is counted, the first and second counters configured to be reset upon a transition in the output signal of the second counter; and
   a toggle latch configured to generate the output signal having predetermined duty cycle, the output signal of the toggle latch configured to transition from a first state to a second state upon a transition in the output signal of the first counter, the output signal of the toggle latch further configured to transition from the second state to the first state upon a transition in the output signal of the second latch.

2. The apparatus of claim 1, the first counter configured to count the first number of cycles of the oscillator signal directly.

3. The apparatus of claim 1, the first counter configured to count the first number of cycles of the inverse of the oscillator signal.

4. The apparatus of claim 1, the first counter configured to count the first number of cycles of either the oscillator signal directly or the inverse of the oscillator signal based on a selection bit.

5. The apparatus of claim 4, the first number being the greatest integer smaller than or equal to half the second number, the selection bit corresponding to the least significant bit of the second number.

6. The apparatus of claim 1, the first state being a logical HIGH, the second state being a logical LOW.

7. The apparatus of claim 1, the first and second numbers being programmable via at least one register.

8. The apparatus of claim 1, the output signal of the first counter configured to generate a pulse after the first number of cycles is counted, the rising edge of the pulse corresponding to the transition in the output signal of the first counter, the output signal of the second counter configured to generate a pulse after the second number of cycles is counted, the rising edge of the pulse corresponding to the transition in the output signal of the second counter.

9. The apparatus of claim 1, the first and second counters being asynchronous counters.

10. A method for generating an output signal having a predetermined duty cycle, the method comprising:
    counting a first number of cycles of a signal derived from an oscillator signal;
    generating a transition in a first output signal after the first number of cycles is counted;
    counting a second number of cycles of the oscillator signal, the second number being greater than the first number;
    generating a transition in a second output signal after the second number of cycles is counted;
    resetting the counting of the first and second numbers upon a transition in the second output signal;
    generating a transition in the output signal from a first state to a second state upon a transition in the first output signal; and
    generating a transition in the output signal from the second state to the first state upon a transition in the second output signal.

11. The method of claim 10, the counting the first number of cycles comprising counting the first number of cycles of the oscillator signal directly.

12. The method of claim 10, the counting the first number of cycles comprising counting the first number of cycles of the inverse of the oscillator signal.

13. The method of claim 10, the counting the first number of cycles comprising counting either the oscillator signal directly or counting the inverse of the oscillator signal based on a selection bit.

14. The method of claim 13, the first number being the greatest integer smaller than or equal to half the second number, the selection bit corresponding to the least significant bit of the second number.

15. The method of claim 10, the first state being a logical HIGH, the second state being a logical LOW.

16. The method of claim 10, further comprising programming the first and second numbers via at least one register.

17. The method of claim 10, the generating the transition in the first output signal comprising generating a pulse in the first output signal, the generating the transition in the second output signal comprising generating a pulse in the second output signal.

18. The method of claim 10, the counting the first number and the counting the second number comprising driving first stages of asynchronous counters with the oscillation signal.

19. An apparatus for generating an output signal having a predetermined duty cycle, the apparatus comprising:
- means for counting a first number of cycles of a signal derived from an oscillator signal, and for generating a transition in a first output signal after the first number of cycles is counted;
- means for counting a second number of cycles of the oscillator signal greater than the first number, and for generating a transition in a second output signal after the second number of cycles is counted;
- means for resetting the counting the first and second numbers upon a transition in the second output signal; and
- means for generating a transition in the output signal from a first state to a second state upon a transition in the first output signal, and for generating a transition in the output signal from the second state to the first state upon a transition in the second output signal.

20. The apparatus of claim 19, further comprising means for selecting the signal derived from the oscillator signal from between the oscillator signal and the inverse of the oscillator signal based on whether the second number is even or odd.

21. A computer program product storing code for causing a computer to generate an output signal having a predetermined duty cycle, the code comprising:
- code for causing a computer to count a first number of cycles of a signal derived from an oscillator signal and generate a transition in a first output signal after the first number of cycles is counted;
- code for causing a computer to count a second number of cycles of the oscillator signal greater than the first number and generate a transition in a second output signal after the second number of cycles is counted;
- code for causing a computer to reset the count of the first and second numbers upon a transition in the second output signal; and
- code for causing a computer to generate a transition in the output signal from a first state to a second state upon a transition in the first output signal and generate a transition in the output signal from the second state to the first state upon a transition in the second output signal.

22. A device for wireless communications, the device comprising at least one digital-to-analog converter (DAC) for converting a digital TX signal to an analog TX signal, at least one baseband TX amplifier for amplifying the analog TX signal, a TX LO signal generator, an upconverter coupled to the TX LO signal generator and the at least one baseband TX amplifier, a TX filter coupled to the output of the upconverter, a power amplifier (PA) coupled to the TX filter, an RX filter, a low-noise amplifier (LNA) coupled to the RX filter, an RX LO signal generator, a downconverter coupled to the RX LO signal generator and the RX filter, at least one low-pass filter coupled to the output of the downconverter, at least one analog-to-digital converter (ADC) for converting the output of the low-pass filter into a digital signal, a clock signal generator, at least one of the DAC and the ADC being driven by a clock signal generated by the clock signal generator, the clock signal generator comprising:
- a first counter configured to count a first number of cycles of a signal derived from an oscillator signal, the output signal of the first counter configured to transition after the first number of cycles is counted;
- a second counter configured to count a second number of cycles of the oscillator signal, the output signal of the second counter configured to transition after the second number of cycles is counted, the first and second counters configured to be reset upon a transition in the output signal of the second counter; and
- a toggle latch configured to generate the clock signal, the output signal of the toggle latch configured to transition from a first state to a second state upon a transition in the output signal of the first counter, the output signal of the toggle latch further configured to transition from the second state to the first state upon a transition in the output signal of the second latch.

* * * * *